(12) United States Patent
Horst (10) Patent No.: US 10,197,971 B1
(45) Date of Patent: Feb. 5, 2019

(54) INTEGRATED OPTICAL CIRCUIT FOR HOLOGRAPHIC INFORMATION PROCESSING

(71) Applicant: INTERNATIONAL BUSINESS MACHINES CORPORATION, Armonk, NY (US)

(72) Inventor: Folkert Horst, Wettingen (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/666,668

(22) Filed: Aug. 2, 2017

(51) Int. Cl.
| | | |
|---|---|---|
| *G03H 1/02* | (2006.01) | |
| *G03H 1/04* | (2006.01) | |
| *G02F 1/01* | (2006.01) | |
| *G03H 1/00* | (2006.01) | |
| *G03H 1/10* | (2006.01) | |
| *G11C 13/04* | (2006.01) | |
| *G06N 3/063* | (2006.01) | |

(52) U.S. Cl.
CPC .......... *G03H 1/024* (2013.01); *G02F 1/0126* (2013.01); *G03H 1/0005* (2013.01); *G03H 1/02* (2013.01); *G03H 1/0402* (2013.01); *G03H 1/0465* (2013.01); *G03H 1/10* (2013.01); *G06N 3/0635* (2013.01); *G11C 13/044* (2013.01); *G03H 2001/026* (2013.01); *G03H 2222/34* (2013.01); *G03H 2223/16* (2013.01); *G03H 2260/54* (2013.01)

(58) Field of Classification Search
CPC ................................ G03H 1/02; G03H 1/265
USPC .......................................... 365/125, 216, 116
See application file for complete search history.

(56) References Cited

U.S. PATENT DOCUMENTS

| | | | | |
|---|---|---|---|---|
| 4,854,678 A | * | 8/1989 | Kitano | ...................... B41J 2/465 359/245 |
| 5,710,667 A | * | 1/1998 | Goto | ..................... G02B 5/1876 250/208.1 |
| 5,818,386 A | * | 10/1998 | Belisle | ..................... H01Q 3/26 342/372 |
| 8,655,813 B2 | | 2/2014 | Ananthanarayanan et al. | |
| 8,676,734 B2 | | 3/2014 | Aparin | |
| 9,542,644 B2 | | 1/2017 | Canoy et al. | |
| 2004/0136644 A1 | * | 7/2004 | Fouquet | ............... G02B 6/3582 385/18 |
| 2004/0164151 A1 | * | 8/2004 | Harris | ................ H04N 1/02409 235/454 |

(Continued)

OTHER PUBLICATIONS

Brady et al., "Holographic interconnections in photorefractive waveguides," Applied Optics, vol. 30, No. 17, Jun. 10, 1991, pp. 2324-2333.

(Continued)

*Primary Examiner* — Michael Tran
(74) *Attorney, Agent, or Firm* — Jordan T. Schiller (57) ABSTRACT

An integrated optical circuit for holographic information processing is disclosed. The optical circuit comprises a photorefractive medium and two transmitter arrays. The transmitter arrays are adapted for locally changing the refractive index of the photorefractive medium for holographic encoding of the information in a working plane of the photorefractive medium by transmitting light via optical paths into the photorefractive medium such that an interference pattern is generated in the working plane. The optical paths and the working plane are arranged in a single optical plane.

18 Claims, 2 Drawing Sheets

(56) References Cited

U.S. PATENT DOCUMENTS

| | | | | |
|---|---|---|---|---|
| 2006/0260416 | A1* | 11/2006 | Sage | G01F 1/7084 73/861.95 |
| 2008/0013881 | A1* | 1/2008 | Welch | G02B 6/12004 385/14 |
| 2008/0094300 | A1* | 4/2008 | Lee | H01Q 21/0006 343/844 |
| 2008/0253727 | A1* | 10/2008 | Wu | G02B 6/122 385/131 |
| 2011/0249330 | A1* | 10/2011 | Anderson | E04H 3/22 359/460 |
| 2013/0222756 | A1* | 8/2013 | Van Heugten | G02F 1/29 349/200 |
| 2015/0248013 | A1* | 9/2015 | Chen | H01Q 15/08 359/625 |
| 2016/0097903 | A1* | 4/2016 | Li | G02B 6/43 385/50 |
| 2016/0202164 | A1* | 7/2016 | Trainer | G01N 15/0211 356/336 |
| 2016/0350647 | A1 | 12/2016 | Hosokawa et al. | |

OTHER PUBLICATIONS

Burr et al., "Experimental demonstration and tolerancing of a large-scale neural network (165,000 synapses), using phase-change memory as the synaptic weight element," IEEE Transactions on Electron Devices, vol. 62, Issue: 11, Nov. 2015, Date of Publication: Jul. 7, 2015, pp. 1-6.

Denz, "Optical Neural Networks," Preface and Part I, Copyright Springer Fachmedien Wiesbaden 1998, Publisher: Braunschweig : Vieweg, [1998] © 1998, Series: Optics and photonics (Braunschweig, Germany), ISBN: 978-3-663-12274-6 (Print) 978-3-663-12272-2 (Online), pp. 1-21.

Owechko, "Optical Neural Networks Based on Distributed Holographic Gratings," Hughes Research Laboratories, N00014-92-C-0187, Final Report, Sep. 29 1992 through Feb. 28, 1996, Office of Naval Research, Arlington, VA, Date of Report: Aug. 13, 1996, pp. 1-96.

Psaltis et al., "Adaptive optical networks using photorefractive crystals," Applied Optics, vol. 27, No. 9, May 1, 1988, pp. 1752-1759.

Shainline et al., "Superconducting optoelectronic circuits for neuromorphic computing," arXiv:1610.00053v2 [cs. NE], Nov. 10, 2016, pp. 1-35.

Tait et al., "Photonic Neuromorphic Signal Processing and Computing," Chapter 8, Nano-Optics and Nanophotonics, DOI: 10.1007/978-3-642-40224-1_8, Copyright Springer-Verlag Berlin Heidelberg 2014, pp. 183-222.

Vittoz et al., "Analog Storage of Adjustable Syntaptic Weights," VLSI Design of Neural Networks, Part of the Springer International Series in Engineering and Computer Science book series (SECS, vol. 122), 1991, pp. 47-48.

* cited by examiner

INTEGRATED OPTICAL CIRCUIT FOR HOLOGRAPHIC INFORMATION PROCESSING

BACKGROUND

The present invention relates to integrated optics, and more specifically, to integrated holographic information processing.

Training of Deep Neural Nets (DNNs) is a computationally demanding task. A large fraction of the computational workload is spent on evaluating signal propagation through the synaptic network that connects the consecutive levels of neurons in the neural net. This synaptic network connects each neuron in a next layer of M neurons to all N neurons in the previous layer, where the strength of each "synaptic" connection is set by a weighting factor. The total input signal to a next-level neuron is given by the weighted sum of output signals from all active neurons in the previous level. Depending on whether this sum reaches a certain threshold level, the neuron will fire or not.

The computational cost of the synaptic processing step for all neurons comprises M×N memory accesses to the weight values, M×N multiplications and M×N additions.

To train the neural network for performing a specific task, all synaptic weight values have to be optimized. This is performed in a training algorithm in which the response of the neural network to an input signal is compared with the desired output. Then the synaptic weights are updated in an iterative procedure to minimize the difference between the output and the desired output. The well-known Back Propagation training process is an established method to determine the synaptic weight factors. One iteration of the backpropagation algorithm requires 3×M×N memory reads, 3×M×N multiplications, 3×M×N additions and M×N memory stores.

It has been shown that speed and power consumption of the weight optimization processing steps (evaluation and update) can be improved massively by performing these steps using analog computation on a dedicated hardware array of M×N nodes where each node locally stores and processes its corresponding weight value. This method overcomes the memory access bottleneck and allows a parallel optimization of all synaptic weights in one connection layer.

Synaptic weight processing using holographic weight storage in photorefractive materials has been demonstrated in free-space optic setups. These setups typically use high-power lasers as light sources, liquid crystal light valves as optical modulators, CCD cameras as detectors and mm to cm scale photorefractive crystals as storage media. However, these systems are hampered by the large size and low stability of the bulk optics and the low speed of the optical modulators and detectors.

In "Holographic interconnections in photorefractive waveguides", Applied Optics, vol. 30, pp. 2324-2333, of 1991, the authors David D. Brady and Demetri Psaltis proposed a partially integrated vector matrix multiplier. In this proposal, the matrix coefficients are stored in a photorefractive planar waveguide and the light beams for matrix evaluation are applied and extracted using integrated optics input and output waveguides. The holographic gratings are written using out-of-plane beams, free space optics and a spatial light modulator (liquid crystal light valve) to encode the information.

SUMMARY

It is an objective of the present invention to provide for a holographic information processing device and methods. Embodiments of the invention are given in the dependent claims. Embodiments of the present invention can be freely combined with each other if they are not mutually exclusive.

In one aspect, the invention relates to an integrated optical circuit for holographic information processing, the optical circuit comprising a photorefractive medium and two transmitter arrays, the transmitter arrays being adapted for locally changing the refractive index of the photorefractive medium for holographic encoding of the information in a working plane of the photorefractive medium by transmitting light via optical paths into the photorefractive medium such that an interference pattern is generated in the working plane, the optical paths and the working plane being arranged in a single optical plane.

In another aspect, the invention relates to a method for holographic information processing, the method comprising:

providing an integrated optical circuit comprising a photorefractive medium and two transmitter arrays; and changing, locally, a refractive index of the photorefractive medium for holographic encoding of information in a working plane of the photorefractive medium by transmitting light from the two transmitter arrays via optical paths into the photorefractive medium such that an interference pattern is generated in the working plane, the optical paths and the working plane being arranged in a single optical plane.

In yet another aspect, the invention relates to a method for holographic information processing, the method comprising:

providing an integrated optical circuit comprising a photorefractive medium, two transmitter arrays, and two receiver arrays, the photorefractive medium comprising a refractive index pattern holographically encoding holographic information; and decoding the holographic information by measuring optical power of a light pulse received by the two receiver arrays, the light pulse being directed through the two transmitter arrays into the photorefractive medium such that it passes the refractive index pattern.

BRIEF DESCRIPTION OF THE SEVERAL VIEWS OF THE DRAWINGS

In the following, embodiments of the invention are explained in greater detail, by way of example only, making reference to the drawings.

DETAILED DESCRIPTION

Driven by telecommunication technology, considerable advances have been made in integrated optical devices during the last two decades. Integrated optical devices are known to deliver improvements in power efficiency and processing speed compared to traditional bulk-optical setups.

Embodiments of the invention may have key advantages which arise from their implementation as an integrated optical device. Compared to known implementations using bulk optics, the integrated optical circuit according, to embodiments of the invention, may feature a higher mechanical and optical stability due to a strong decrease in the number of degrees of freedom. Moreover, the integrated optical circuit may allow for an encapsulation of light, and therefore the photorefractive effect may be achieved with a lower amount of optical power. Another advantage may be the availability of non-absorptive and/or high speed optical devices for integrated optics, such as optical modulators and tunable power splitters. The integrated optical circuit according to embodiments of the invention is clearly characterized and discernable from the state of the art in that the optical parts (e.g. transmitter arrays, mirrors) for interacting with the photorefractive medium (including writing the information to the photorefractive medium by generating the interference pattern) are arranged in a single plane (i.e. the optical plane as defined below).

Possible advantages of embodiments of the invention will be outlined in more detail in the remaining description. Examples given in the description are meant solely for the purpose of illustration, but not as a limitation, as alternatives will be known or apparent to a person of ordinary skill in the art for each example given. Furthermore, descriptions of embodiments given herein will assume the optical plane to be horizontal, solely for the purpose of simplification of the description, as embodiments of the invention are not restricted to be manufactured or used in a horizontal orientation.

The integrated optical circuit disclosed herein may advantageously deploy integrated optics for holographic information storage and processing. Various technologies and/or technology nodes are available for implementing an integrated optical circuit according to embodiments of the invention. Usually, the structural dimensions and operating wavelengths of the integrated optical circuit will be determined by the chosen integration technology. A commonly used, but not restrictive example is silicon photonics, which allows for manufacturing integrated optical devices from silicon as the optical medium. Silicon is transparent in the range of about 1.3-2.0 µm. Hence, typical structural dimensions are in the µm to mm range, with overall device dimensions in the mm to cm range. Manufacturing the integrated optical circuit in silicon photonics may be especially advantageous because a wide range of material manufacturing techniques is available for silicon micro-structuring from silicon electronics manufacturing.

According to embodiments, the photorefractive medium is formed as a wave guiding layer. Compared to a bulk optical setup, a photorefractive wave guiding layer, which may also be characterized as a slab waveguide or a thin layer, may beneficially allow for causing the photorefractive effect with less optical energy than for a thick optical crystal adapted for incorporating a volume hologram. In an example, a wave guiding layer of 1 mm×1 mm×1 µm requires an optical power reduced by a factor of 1000 compared to a photorefractive volume crystal of 1 mm$^3$ to create an identical interference pattern for holographic encoding of the information.

The photorefractive medium may be formed by any photorefractive material which is suitable for manufacturing on the selected integration technology. A non-exhaustive selection of photorefractive materials includes barium titanate ($BaTiO_3$), lithium niobate ($LiNbO_3$), vanadium doped zinc telluride (ZnTe:V), an organic photorefractive material, a photorefractive photopolymer, or a photorefractive semiconductor including a III/V semiconductor such as GaAs.

The integrated optical circuit may further comprise a light source. Any light source used for holographic encoding of the information in the photorefractive medium should be capable of generating coherent light in order to create the interference pattern in the working plane of the photorefractive medium. An integratable coherent light source may be a laser diode, which may be implemented as a discrete device or integrated in the transmitter arrays. Preferably, the light is produced by a single coherent light source and then distributed to the transmitter arrays, e.g. using a sequence of optical waveguides and power splitters.

In an example, a coherent light source external to the integrated optical circuit is utilized for generating the light for performing the holographic information processing. According to an embodiment, the optical circuit further comprises a photorefractive medium and two transmitter arrays, the transmitter arrays being adapted for locally changing the refractive index of the photorefractive medium for holographic encoding of the information in a working plane of the photorefractive medium by transmitting light via optical paths into the photorefractive medium such that an interference pattern is generated in the working plane, the optical paths and the working plane being arranged in a single optical plane. A light input may allow for using a light source which overcomes limitations of integratable coherent light sources, e.g. regarding optical output power, wavelength, and/or dimensions. The light input may be implemented as a suitable optical window providing an optical access to the transmitter arrays or optical waveguides optically coupled to the transmitter arrays as described above. The light input may provide further optical functionality, such as a lens or an increased aperture which may simplify the coupling of an external light beam into the optical circuit.

A transmitter array can be any device capable of providing an array of point sources which are adapted for locally changing the refractive index of the photorefractive medium for holographic encoding of the information in a working plane of the photorefractive medium by transmitting light via optical paths into the photorefractive medium such that an interference pattern is generated in the working plane. The array of point sources is preferably one-dimensional, such that the optical paths are provided in a single optical plane within the working plane of the photorefractive medium. More specifically, the point sources are individually controllable, allowing for creating a custom one-dimensional light pattern. Controlling a point source may include switching the point source on or off, and/or modulating the light generated by the point source in terms of amplitude modulation, phase modulation, frequency modulation, and the like.

A point source may be a discrete device capable of generating the light, or an open end of an essentially one-dimensional optical waveguide. According to an embodiment, each of the transmitter arrays comprises an electrical input and an array of output waveguides, the output waveguides being adapted for transmitting the light into the photorefractive medium, each of the transmitter arrays being adapted for modulating the light transmitted through each of the output waveguides based on an electrical modulation signal received through the electrical input in order to encode the information. Using an array may have the advantage that each of the output waveguides may be used to couple a beam of light into the photorefractive medium from a slightly different angle. This way, multiple instances of information may be holographically stored in the photorefractive medium by invoking the photorefractive effect by creating a unique interference pattern for each combination of an output waveguide of a first one of the transmitter arrays and an output waveguide of the second one of the transmitter arrays. Particularly, the photorefractive medium may thus be used to store two-dimensional information such as entries of a matrix.

According to an embodiment, the integrated optical circuit is adapted for encoding the information by simultaneously generating the interference pattern for at least two different combinations of an output waveguide of a first one of the transmitter arrays and an output waveguide of a second one of the transmitter arrays. Providing the transmitter arrays with arrays of output waveguides may enable a simultaneous programming of the photorefractive medium with information supplied by more than one pair of output waveguides.

In environments deploying the integrated optical circuit with an external source, the transmitter arrays may be adapted for distributing the optical power from the external source to the array of output waveguides in several different ways. According to an embodiment, at least one of the transmitter arrays comprises a binary tree of passive power splitters, the tree being adapted for distributing the light into the output waveguides, the at least one transmitter array further comprising an optical modulator for at least part of the output waveguides, the optical modulator being adapted for performing the light modulation. This may allow for individual control of the output waveguides by providing a homogeneous light distribution to the output waveguides which is then modulated by a dedicated array of modulators or a suitable multichannel modulator.

According to an embodiment, at least one of the transmitter arrays comprises a binary tree of electrically controllable power splitters, the tree being adapted for distributing the light into the output waveguides, the electrically controllable power splitters being adapted for performing the light modulation being an alternative way of individually controlling the output waveguides, embodiments using a binary tree of electrically controllable power splitters may yield the further advantage of essentially lossless, non-absorptive distribution of optical power to the output waveguides. While the modulation characteristics, such as intensity or phase, can be set directly for each output waveguide with embodiments comprising a binary tree of passive power splitters, the modulation characteristics must be calculated for each output waveguide in a binary tree of electrically controllable power splitters as the product of all modulation characteristics sets along the respective path through the binary tree, as the modulation characteristics of each level of the three are determined by the modulation characteristics set on the previous tree level.

According to an embodiment, the modulation is amplitude modulation and/or phase modulation. In particular, the transmitter arrays may provide both modulation functionalities at the same time. Implementations comprising a binary tree of power splitters may be of the active or passive type for both modulation types, or alternatively, use one of the two different tree types for each type of modulation. More precisely, a binary tree of passive power splitters in terms of amplitude or intensity modulation may be followed by an intensity modulator, such as a spatial light modulator, to perform the amplitude modulation, while each node of the binary tree of passive power splitters comprises an electrically controllable phase modulator (e.g. a fiber optical phase modulator) for performing the phase modulation as an active binary tree, or vice versa. On the other hand, the binary tree may be electrically controllable for amplitude modulation and phase modulation on each node, or it may be a fully passive binary tree of passive power splitters, followed by a sequence of a phase modulator and an amplitude modulator for each of the output waveguides.

It is understood by a person of ordinary skill in the art that the transmitter arrays may comprise further optical functionality, such as an amplifier, to enable further customization of the light to be provided to the photorefractive medium.

Exemplary embodiments of the integrated optical circuit use silicon optics, a photorefractive medium implemented as a waveguide slab, and transmitter arrays comprising a one-dimensional array of between 100 and 2000 optical waveguides as the output waveguides. This corresponds to an envisioned information density up to an order of $10^6$ units of information per sq. mm.

The integrated optical circuit may also be adapted for receiving light transmitted through the photorefractive medium. According to an embodiment, the circuit further comprises two receiver arrays, each of the receiver arrays comprising an electrical output and being adapted for measuring optical power received from the photorefractive medium, generating an electrical signal encoding the measured power, and outputting the electrical signal through the electrical output, the optical circuit being adapted for controlling the holographic encoding using the electrical output as feedback. A receiver array comprises a plurality of means for converting optical power into an electrical quantity such as voltage or current, for instance, a plurality of photodiodes. The converting elements are preferably arranged in a one-dimensional array to enable spatially resolved detection of light transmitted through the photorefractive medium. The two receiver arrays may be arranged on different sides with respect to the photorefractive medium. In an example, the receiver arrays are arranged in a 90° orientation around the photorefractive medium so as to detect a beam of light incident to the photorefractive medium from an optical path opposite to one of the two receiver arrays once in transition (using the transmitter array in opposition to the incident optical path), and concurrently in reflection (using the receiver array arranged in the 90° position).

According to an embodiment, each of the receiver arrays further comprises a plurality of input waveguides, each of the receiver arrays being adapted for independently measuring optical power received from the photorefractive medium by at least a receiving portion of the input waveguides, the electrical signal encoding the measured optical power and an identifying information for each of the receiving input waveguides. The input waveguides may be implemented as discussed above for the output waveguides which may be used for the transmitter arrays according to embodiments of the invention. Input waveguides are preferably interfacing the opto-electrical converters (such as photodiodes) and the optical path connecting the photorefractive medium with the respective receiver array and may therefore decrease the converter's sensitivity to erroneous signals such as light signals originating from different sources than the photorefractive medium or cross talk between neighboring converting elements.

The receiver arrays may also be adapted for performing phase sensitive detection of the light received from the photorefractive medium. According to an embodiment, each of the receiver arrays is optically coupled to the light input and is further adapted for measuring the phase difference between the light received from the photorefractive medium and the light received from the light input, the electrical signal further encoding the measured phase difference. A phase information, which may be holographically encoded in the photorefractive medium using phase modulation as discussed above, may be beneficial for storing an additional informational degree of freedom. The integrated optical circuit may therefore be used to write and read multipolar information to/from the photorefractive medium. A simple example of multipolar data is positive and negative numbers being encoded holographically using two different phase angles, e.g. 0° representing a positive number, and 180° representing a negative number. The concept can, however, be generalized to more than two information polarities, which may be encoded holographically by a corresponding number of modulated phase angles. A phase sensitive receiver array may use a phase sensitive optical element (for example a hybrid coupler) on each channel to compare the phase of the light received from the photorefractive medium with the phase of the reference beam received from the light input or the coherent local light source. However, it is also possible to restore holographically encoded phase information with a phase insensitive detector, as will be discussed further below.

The electrical signal generated by each of the receiver arrays may encode the previously holographically stored information, particularly including the amplitude information, the phase information, and the identifying information, in various different ways known or apparent to a person skilled in the art. Non-exhaustive examples of electrical signals encoding such information include a serial signal, a parallel signal, a direct current (DC) signal, an alternating current (AC) signal, a digital signal, and combinations thereof. In a more specific example, each channel representing one of the input waveguides is mapped to one channel of a parallel signal and encodes previously holographically stored pieces of amplitude and phase information in the amplitude and phase of an AC signal transmitted through the given parallel channel.

The transmitter arrays may be arranged relative to the photorefractive medium such that the optical paths along which the light propagates from the transmitter array into the photorefractive medium span a certain distance. The light may be coupled out into the optical paths spanning that distance such that it may be processed further before being coupled into the photorefractive medium. According to an embodiment of the invention, the optical circuit further comprises a propagation region adapted for coupling the light received from the transmitter arrays into the photorefractive medium. The propagation region is a region of the integrated optical circuit where the light can propagate between the transmitter arrays and the photorefractive medium without being confined by optical guiding structures such as the output waveguides or the input waveguides. Allowing the light to travel through this propagation region may have the advantage that a particular beam of light coupled out from the transmitter array can expand within the optical plane, or horizontally, such that its width spans a major part of the overall width of the photorefractive medium as it is coupled into the photorefractive medium. This may yield a higher precision and reliability for restoring the information thus holographically stored.

The optical paths and the working plane are arranged in a single optical plane. This optical plane is a theoretical reference plane in which all optical paths involved in the holographic encoding and/or decoding of the information are disposed such that they stand at least one dimension comprised by the optical plane. In particular, the optical plane spans a finite length of the output waveguides and the input waveguides such that each open end of the output and input waveguides lies within the optical plane and the optical paths along which the light propagates to and from the photorefractive medium lie within the optical plane.

This planar optical alignment may be further supported by implementing the propagation region such that the light is vertically guided towards the photorefractive medium. According to an embodiment of the invention, the propagation region is confined perpendicular to the optical plane by cladding layers having a lower refractive index than the propagation region. This may be beneficial to provide a stable and essentially lossless optical coupling between the propagation region and the transmitter arrays. Analogously, the cladding layers may also be used to guide the light vertically through another propagation region spanning a part of the integrated optical circuit between the photorefractive medium and the receiver arrays to gain the same advantage also for reading out the holographically stored information.

Preferably, the propagation region is filled with the core material of the optical waveguides (e.g. the input waveguides and/or the output waveguides) such that the light encounters no change in refractive index when coupled between the optical waveguides and the propagation region. Analogously, the cladding layers may be made of the same material as the cladding used for guiding the light through the optical waveguides. However, using a different cladding material may be more advantageous for the particular needs of a given implementation as long as its refractive index allows for guiding the light through the propagation region by total reflection.

The propagation region may be used to implement optical devices in order to exert additional control on the light propagating through the propagation region. According to an embodiment, the propagation region comprises a first set of optical elements arranged in the optical paths and optically coupling the photorefractive medium to at least one of the transmitter arrays. This may also be of use to control a beam of light between the photorefractive medium and the receiver arrays. According to an embodiment of the invention, the propagation region comprises a second set of optical elements, the second set being arranged in the optical paths and optically coupling the photorefractive medium to at least one of the receiver arrays.

Numerous optical elements such as mirrors or lenses may be formed in the photorefractive region. For example, the mirror may be formed by creating a slot of a suitable geometry in the material filling the propagation region. This may be accomplished, for instance, using an etch process within the geometry needed to implement a mirror of the desired shape. The cavity thus formed in the material filling out the propagation region creates an optical surface from which the light travelling through the propagation region may be reflected by total reflection if the orientation of the cavity has been chosen appropriately. For example, a plane mirror can be formed by etching a straight slot into the material filling the propagation region in an orientation which crosses the optical path pursued by a wave, e.g. emanating from a transmitter array in an angle exceeding the critical angle of total internal reflection. Plane mirrors may be beneficial for folding the optical paths in order to achieve a more complex setup of the integrated optical circuit.

Special optical elements such as curved mirrors may be formed in the propagation region to provide means for focusing and/or defocusing light traveling through the propagation region. According to an embodiment of the invention, the first set of optical elements is adapted for transforming a light wave emerging from at least one of the transmitter arrays into a plane light wave incident to the photorefractive medium. Coupling a plane wave into the photorefractive medium may minimize reflective losses at the interface between the propagation region and the photorefractive medium and enable a controlled, straight propagation of the light through the photorefractive medium.

According to an embodiment, the photorefractive medium is confined in the optical plane by plane coupling surfaces of perpendicular orientation with respect to the optical plane, the coupling surfaces being adapted for coupling the light in and out of the photorefractive medium. This may advantageously facilitate an essentially lossless coupling of planar light waves in and out of the photorefractive medium. Furthermore, planar light waves are collimated to a width which defines an interaction region between the two light beams incident to the photorefractive medium. A planar light wave having travelled through the photorefractive medium may exit the photorefractive medium again through one of the plane coupling surfaces and continue to propagate through the propagation region interfacing the photorefractive medium and the receiver arrays still as a planar wave.

According to an embodiment of the invention, the second set of optical elements is adapted for focusing a plane light wave emerging from the photorefractive medium onto at least one of the receiver arrays. In the same vein as the first set of optical elements discussed above, the second set of optical elements may comprise, e.g. a curved mirror in order to focus a plane wave emerging the photorefractive medium, e.g. onto the input waveguides of one of the receiver arrays. Altogether, the first and second sets of optical elements may advantageously provide the capability to handle the light for holographic information processing such that it is precisely focused at the transmitter and receiver arrays, while travelling straightly and essentially losslessly through the photorefractive medium.

The integrated optical circuit may form an advantageous combination of the geometrical shape of the photorefractive medium and the arrangement of the transmitter and receiver arrays around the photorefractive medium. According to an embodiment of the invention, the photorefractive medium has a square cross-section parallel to the optical plane, and the receiver arrays and the transmitter arrays are arranged around the photorefractive medium in relative angular distances of 90° to each other and in the sequence transmitter array, transmitter array, receiver array, receiver array in a constant sense of rotation around the photorefractive medium, the optical path optically coupling each of the transmitter arrays with one coupling surface of the photorefractive medium, the optical paths crossing the respective coupling surface in perpendicular direction, each of the receiver arrays being optically coupled to one further coupling surface of the photorefractive medium by further optical paths, the further optical paths crossing the further coupling surfaces in perpendicular direction.

In general, the topology of optical paths in the setup is governed by the combination of photorefractive material and polarization of light chosen for a particular setup. With GaAs as photorefractive material, the 90° layout may work with light polarized perpendicular to the optical plane, but this choice of polarization is less commonly used for Silicon photonics circuits. With light polarized in the optical plane, another relative angle may have to be used. In the following discussion of FIG. 1, the prospective suitability of the setup for performing subsequent or simultaneous reading and writing operations for holographic encoding of the information in the photorefractive medium is demonstrated with the example of a 90° layout.

Figure 1:
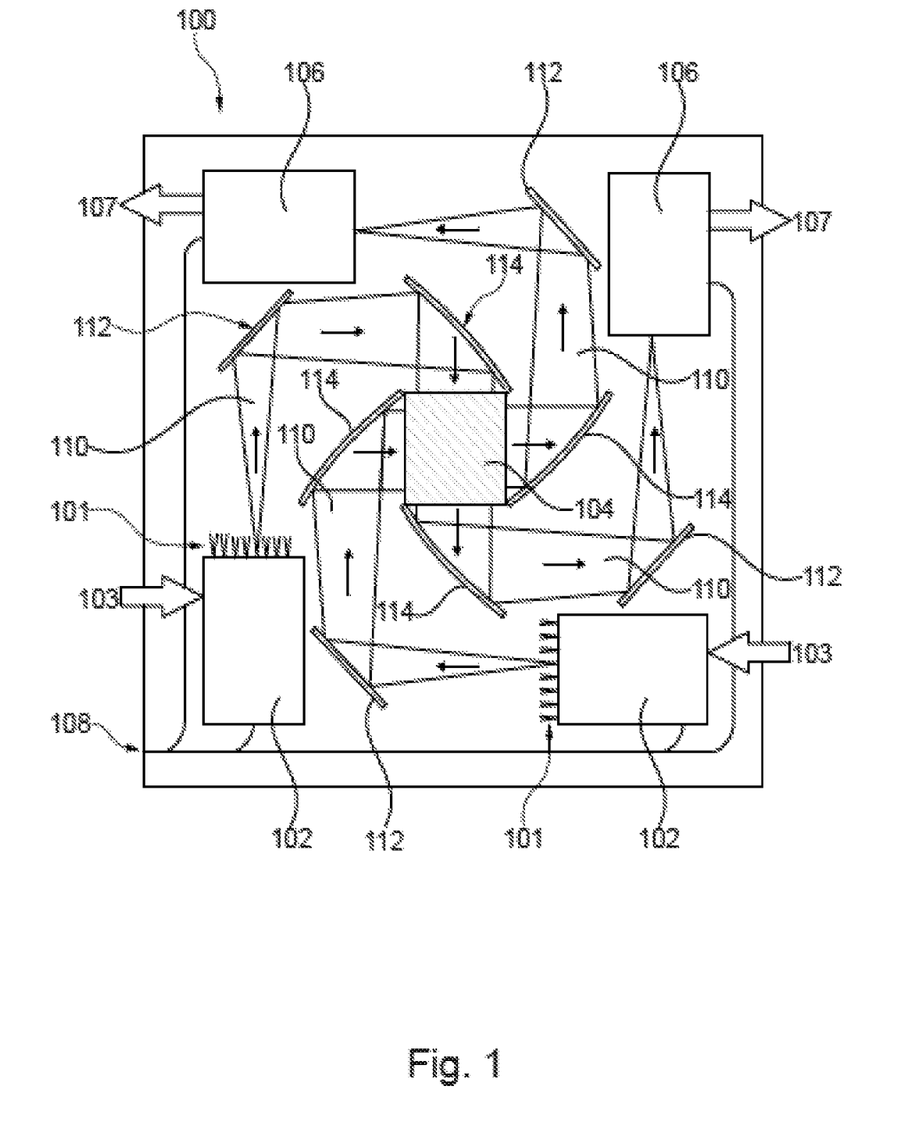
FIG. 1 depicts a schematic cut through an exemplary integrated optical circuit.

FIG. 1 shows a schematic cut through the optical plane of an exemplary integrated optical circuit 100 incorporating various embodiments of the invention. The photorefractive medium 104 is placed at the center of optical circuit 100. It comprises a square cross-section parallel to the optical plane, exhibiting four plane coupling surfaces to the propagation region 110 surrounding the photorefractive medium 104. Two transmitter arrays 102 are located in two neighboring corners of the square optical circuit 100. Each transmitter array 102 comprises an array of output waveguides 101 arranged in the optical plane, and an electrical input 103. The transmitter arrays 102 are receiving light from an external coherent light source (not depicted) coupling light into the integrated optical circuit 100 through light input 108.

Two detector arrays 106 are located in the two neighboring corners opposite to the neighboring corners hosting the transmitter arrays 102. Each detector array 106 comprises an electrical output 107. The positions of electrical inputs 103 and electrical outputs 107 are indicated by thick arrows. The light from the external light source is distributed from light input 108 towards transmitter arrays 102 and reference inputs of detector arrays 106 through a series of optical waveguides and beam splitters. To illustrate the functionality of the optical setup, the transmitter arrays 102 are depicted as distributing the light they are receiving from the light input 108 towards a single output waveguide such that the course of the light following the optical path towards the photorefractive medium 104 through propagation region 110 is clearly visible.

The transmitter arrays 102 are oriented such that the light starts to travel through the propagation region 110 towards a respectively neighboring corner of optical circuit 100. The light beams diverge and are deflected towards a central axis of setup 100 by flat mirrors 112 etched into the propagation region 110. Close to the photorefractive medium 104, each light beam has the same width as the interaction region of the photorefractive medium 104, is transformed into a beam of plane waves and deflected into photorefractive medium 104 by a curved mirror 114 etched into the medium filling the propagation region in a position centered on the respective central axis of setup 100 crossed by the respective light beam. The light beams transmitted by transmitter arrays 102 enter the photorefractive medium 104 through two separate ones of the plane coupling surfaces 90° apart from each other.

In the photorefractive medium 104, the two plane light waves superpose with each other, forming a regular interference pattern over the whole area of the photorefractive medium 104. The optical power coupled into photorefractive medium 104 is chosen such that the photorefractive effect is invoked in the photorefractive medium 104 such that the spatial modulation of the refractive index of the photorefractive medium 104, which is referred to as a refractive index grating, is formed by the superposing beams of light. Due to the different positions of the point sources along the array, each source generates a plane wave under a slightly different angle in the interaction region.

A grating created this way may holographically encode the information to be stored in the photorefractive medium 104 in several parameters which can be set using the modulation techniques discussed above. All gratings, for all point source combinations from the two transmitter arrays, overlap over the whole photorefractive area. An amplitude or intensity modulation may result in a change of reflectivity of the grating. A phase modulation of one of the superposed light beams may result in a lateral shift of the grating about a fraction of the grating constant. The frequency modulation may result in a change of line density of the grating.

The information encoded by a particular refractive index grating may be read out using the light beam or light pulse sent through one of the output waveguides which were used to create the respective refractive index grating. Light crossing the refractive index grating in the photorefractive medium 104 will be partially transmitted through the grating, preserving its propagation direction, and partially reflected away from its original propagation direction. In the readout phase, when one of the point sources is activated, due to the selectivity of the gratings, only the gratings that were written using exactly this point source will constructively reflect a part of the light. All the other gratings will not interact with light from this point source.

As a peculiarity of the depicted square-shaped photorefractive medium, in conjunction with the suitable arrangement of the transmitters and the first set of optical elements comprising the two plane mirrors and the two curved mirrors mentioned above, the readout beam and the refractive index grating are oriented such that the transmitted parts of the readout beam is coupled out of the photorefractive medium 104 into propagation region 110 through a third one of the plane coupling surfaces, while the reflected part of the readout light beam is coupled into the propagation region through the fourth plane coupling surface of the square-shaped photorefractive medium. The second set of optical elements also comprises two curved mirrors 114 and two flat mirrors 112, the curved mirrors 114 focusing each of the emerging partial readout light beams onto the aperture of one of the receiver arrays, and each pair of the curved mirror 114 and the flat mirror 112 folding one of the beams about 90° to yield the more complex design of the integrated optical circuit. The two receiver arrays may then be used to perform a phase sensitive detection of the intensity distribution encoded by the refractive index grating at the position in the photorefractive medium selected for transmission of the readout beam. The receiver arrays 106 convert the information retrieved from the refractive index grating into electrical signals which are then put out through electrical outputs 107.

This way, the setup depicted in FIG. 1 may be used for subsequent and/or simultaneous encoding or decoding of multiple instances of information using the photorefractive medium and a vectorial combination of the output waveguides transmitting modulated light beams or light pulses into the photorefractive medium. The electrical signals presented at the electrical outputs 107 may be used for further processing, including feedback to the electrical inputs 103. Depending on the kind of processing applied to the output generated by the integrated optical circuit, an integrated optical circuit like the exemplary optical circuit depicted in FIG. 1 may therefore be used to perform a closed loop of reading and writing operations which may eventually result in a convergence of the information holographically stored on the photorefractive medium. This procedure may be useful to perform a training operation in a deep neural network (DNN).

The methods for holographic information processing according to aspects of the invention as specified in the summary may yield the same advantages regarding energy efficiency, computational speed, and optical stability as outlined above for the integrated optical circuit as they provide and use the same for holographically encoding or, respectively, decoding the information in the working plane of the photorefractive medium.

As was noted above, the integrated optical circuit may be used for phase sensitive decoding of the information stored in the photorefractive medium even if the receiver arrays are not adapted for phase sensitive detection, e.g. utilizing suitable hybrid couplers.

According to an embodiment, the information comprises an amplitude information and a phase information, each of the transmitter arrays being adapted for applying a phase modulation to the transmitted light, the decoding comprising:

selecting a constant first phase difference between the two transmitter arrays for the phase modulation;

measuring the optical power of a first light pulse received by the two receiver arrays, the first light pulse being directed through the two transmitter arrays into the photorefractive medium such that it passes the refractive index pattern, the two transmitter arrays being set to the constant first phase difference;

selecting a constant second phase difference between the two transmitter arrays for the phase modulation, the constant second phase difference differing from the constant first phase difference by between 45 and 135 degrees;

measuring the optical power of a second light pulse received by the two receiver arrays, the second light pulse being directed through the two transmitter arrays into the photorefractive medium such that it passes the refractive index pattern, the two transmitter arrays being set to the constant second phase difference; and decoding the amplitude information and the phase information from the optical power measured for the first light pulse and the second light pulse.

Figure 2:
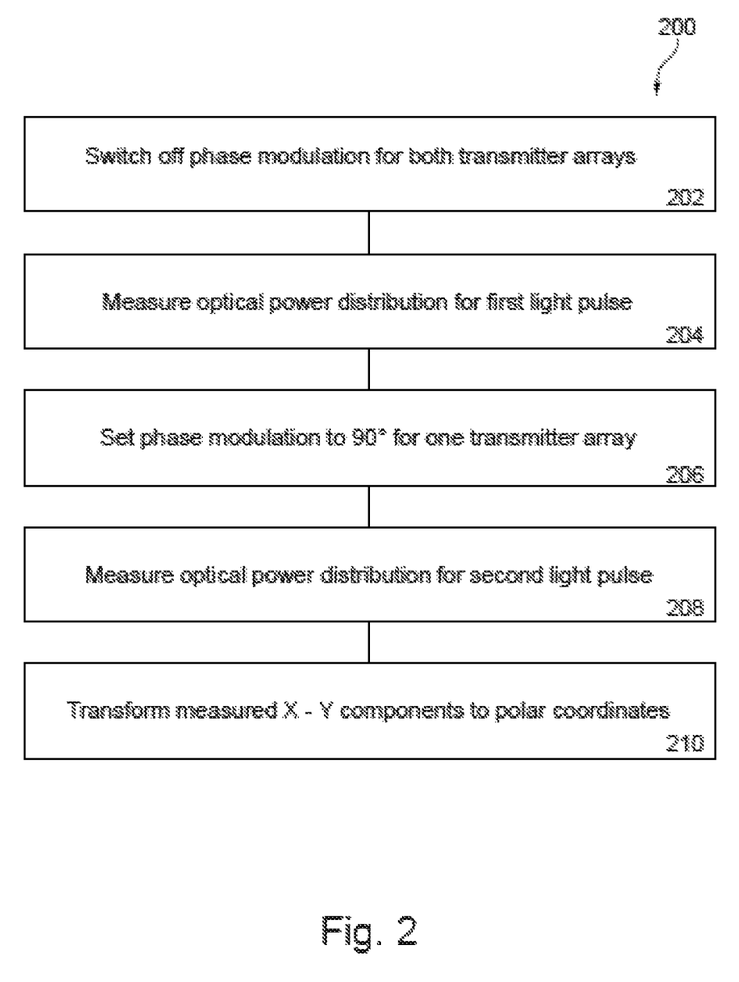
FIG. 2 is a block diagram representing an exemplary method for holographic information processing.

The advantage of enabling phase sensitive decoding with phase insensitive receiver arrays can be illustrated with reference to FIG. 2, which depicts a flow diagram illustrating the method 200 according to the aforementioned embodiment for the special case that the first phase difference is set to 0° and the second phase difference is set to 90°. At block 202, phase modulation is switched off for both transmitter arrays. A light pulse distributed to and transmitted through the two transmitter arrays will thus feature a phase difference of 0° between the two portions of the light beam transmitted through each of the transmitter arrays. This is also the case for the first light pulse, which is transmitted through both transmitter arrays simultaneously at block 204. The first light pulse is coupled into the photorefractive medium simultaneously through two different coupling surfaces of the photorefractive medium.

The first light pulse is transmitted and reflected by the refractive index pattern (e.g. one or more refractive index gratings) representing the stored information. The two portions of the first light pulse thus influenced by the refractive index pattern then leave the photorefractive medium through two further different coupling surfaces and continues to propagate towards the two receiver arrays, e.g. directed by the second set of optical elements. The receiver arrays measure the optical power distribution of the first light pulse transmitted through each of the branches.

At block 206, the phase modulation is set to 90° for one transmitter array, such that a phase difference of 90° is created between the two transmitter arrays. Afterwards, analogously to block 204, at block 208 the second light pulse is transmitted through the transmitter arrays set to the phase difference of 90°, interacts again with the refractive index pattern representing the stored information in the photorefractive medium, and is directed to the receiver arrays where its optical power distribution is measured. Preferably, the intensity of the first light pulse is selected low enough such that the influence of the first light pulse on the information holographically stored in the photorefractive medium is minimized.

At block 210, the optical power measured for each channel of the two receiver arrays for the first light pulse is interpreted as a Cartesian x-component, and analogously, each optical power measured for the second light pulse is interpreted as a Cartesian y-component. The two Cartesian components thus independently measured with a relative phase difference of 90° may then be subject to a coordinate transformation into polar coordinates, resulting in the desired pair of an amplitude and a phase retrieved by each of the respective channels from the holographically stored information in the photorefractive medium. This way, the phase information stored in the refractive index pattern is restored by two subsequent measurements performed with a setup which is not supporting a direct optical phase observation.

In an exemplary usage scenario, the integrated optical circuit is deployed as a synaptic weight storage in a neuromorphic computing system. In holographic synaptic weight storage, the input signals from N input neurons are encoded onto N plane waves that propagate under different angles in the photorefractive storage material. These plane waves represent the input columns of the storage array. The output rows of the array are represented by another set of M plane waves that propagate under another set of different angles. Weighted coupling of light from an input to an output plane wave, corresponding to synaptic coupling from an input to an output neuron, is provided by diffraction on a refractive index grating, written in the photorefractive medium. For each of the M×N synaptic weight elements there exists a unique coupling grating, characterized by a unique combination of grating orientation and grating period. The amount of light coupled by the grating, the synaptic weight, is determined by the refractive index modulation depth of the grating which can be adjusted.

For the evaluation step, the amplitudes of the N optical input plane waves are set (modulated) according to the signals from the N source neurons. Light is then diffracted toward the different output plane waves, proportional to the strength of the corresponding diffraction grating (the multiply operation). All signals that are diffracted into one output plane wave are focused onto one of the transmitter arrays where they add (coherently), and are converted to an electrical signal that is sent to the corresponding output neuron for further processing.

A diffraction grating for a certain synapse can be formed and modified by providing two plane light waves, under the row and column angles corresponding to the addressed synapse. These waves interfere and the corresponding optical interference pattern writes a refractive index pattern through the photorefractive effect. This process maps directly to the update step required for the Backpropagation algorithm for training of Deep Neural Networks.

More generally, in view of its property of connecting a pair of one-dimensional inputs with a pair of one-dimensional outputs via a two-dimensional data storage, the integrated optical circuit may be used as an optical calculator for performing mathematical matrix and vector operations. In analogy to the synaptic weights mentioned above, the information stored in the photorefractive medium may represent numerical entries of a matrix, while the modulation characteristics of light transmitted through a given output waveguide may represent the numerical value of a corresponding vector entry. This way, a matrix-vector multiplication may be performed by transmitting a light pattern modulated with the vector entries into the photorefractive medium.

The invention can also be described by the following features:

An integrated optical circuit for holographic information processing, the integrated optical circuit including a photorefractive medium and two transmitter arrays, the two transmitter arrays being adapted for locally changing a refractive index of the photorefractive medium for holographic encoding of the holographic information in a working plane of the photorefractive medium by transmitting light via optical paths into the photorefractive medium such that an interference pattern is generated in the working plane, the optical paths and the working plane being arranged in a single optical plane.

The integrated optical circuit of feature 1, wherein each of the two transmitter arrays include an electrical input and an array of output waveguides, the array of output waveguides being adapted for transmitting the light into the photorefractive medium, each of the two transmitter arrays being adapted for modulating the light transmitted through the array of output waveguides based on an electrical modulation signal received through the electrical input in order to encode the holographic information.

The integrated optical circuit of feature 2, being adapted for encoding the holographic information by simultaneously generating the interference pattern for at least two different combinations of an output waveguide of a first one of the two transmitter arrays and an output waveguide of a second one of the two transmitter arrays.

The integrated optical circuit of feature 2, wherein at least one of the two transmitter arrays including a binary tree of passive power splitters, the binary tree being adapted for distributing the light into the array of output waveguides, the at least one of the two transmitter arrays further comprising an optical modulator for at least part of the array of output waveguides, the optical modulator being adapted for performing the light modulation.

The integrated optical circuit of feature 2, wherein at least one of the two transmitter arrays including a binary tree of electrically controllable power splitters, the binary tree being adapted for distributing the light into the array of output waveguides, the electrically controllable power splitters being adapted for performing the light modulation.

The integrated optical circuit of feature 2, wherein the modulation of the light includes either being amplitude modulation and/or phase modulation.

The integrated optical circuit of feature 1, further including a propagation region adapted for coupling the light received from the two transmitter arrays into the photorefractive medium.

The integrated optical circuit of feature 7, wherein the propagation region being confined perpendicular to the single optical plane by cladding layers having a lower refractive index than the propagation region.

The integrated optical circuit of feature 7, wherein the propagation region including a first set of optical elements arranged in the optical paths and optically coupling the photorefractive medium to at least one of the two transmitter arrays.

The integrated optical circuit of feature 9, wherein the first set of optical elements being adapted for transforming a light wave emerging from the at least one of the two transmitter arrays into a plane light wave incident to the photorefractive medium.

The integrated optical circuit of feature 1, further including a light input adapted for transmitting the light into the integrated optical circuit, each of the two transmitter arrays being optically coupled to the light input and being adapted for transmitting the light received from the optical input into the photorefractive medium.

The integrated optical circuit of feature 1, further including two receiver arrays, each of the two receiver arrays including an electrical output and being adapted for measuring optical power received from the photorefractive medium, generating an electrical signal encoding the measured optical power, and outputting the electrical signal through the electrical output, the integrated optical circuit being adapted for controlling the holographic encoding using the electrical output as feedback.

The integrated optical circuit of feature 12, wherein each of the two receiver arrays further includes a plurality of input waveguides, each of the two receiver arrays being adapted for independently measuring optical power received from the photorefractive medium by at least a receiving portion of the plurality of input waveguides, the electrical signal encoding the measured optical power and an identifying information for each of the receiving portion of the plurality of input waveguides.

The integrated optical circuit of feature 12, wherein each of the two receiver arrays being optically coupled to the light input and being further adapted for measuring a phase difference between the light received from the photorefractive medium and the light received from the light input, the electrical signal further encoding the measured phase difference.

The integrated optical circuit of feature 12, wherein a propagation region includes a second set of optical elements, the second set of optical elements being arranged in the optical paths and optically coupling the photorefractive medium to at least one of the two receiver arrays.

The integrated optical circuit of feature 15, wherein the second set of optical elements being adapted for focusing a plane light wave emerging from the photorefractive medium onto at least one of the two receiver arrays.

A method for holographic information processing, the method including:
  providing an integrated optical circuit comprising a photorefractive medium and two transmitter arrays; and
  changing, locally, a refractive index of the photorefractive medium for holographic encoding of information in a working plane of the photorefractive medium by transmitting light from the two transmitter arrays via optical paths into the photorefractive medium such that an interference pattern is generated in the working plane, the optical paths and the working plane being arranged in a single optical plane.

A method for holographic information processing, the method including:
  providing an integrated optical circuit comprising a photorefractive medium, two transmitter arrays, and two receiver arrays, the photorefractive medium comprising a refractive index pattern holographically encoding holographic information; and
  decoding the holographic information by measuring optical power of a light pulse received by the two receiver arrays, the light pulse being directed through the two transmitter arrays into the photorefractive medium such that it passes the refractive index pattern.

The method of feature 18, wherein the holographic information includes an amplitude information and a phase information, each of the two transmitter arrays being adapted for applying a phase modulation to the light pulse, the decoding including:
  selecting a constant first phase difference between the two transmitter arrays for the phase modulation;
  measuring the optical power of a first light pulse received by the two receiver arrays, the first light pulse being directed through the two transmitter arrays into the photorefractive medium such that it passes the refractive index pattern, the two transmitter arrays being set to the constant first phase difference;
  selecting a constant second phase difference between the two transmitter arrays for the phase modulation, the constant second phase difference differing from the constant first phase difference by between 45 and 135 degrees;
  measuring the optical power of a second light pulse received by the two receiver arrays, the second light pulse being directed through the two transmitter arrays into the photorefractive medium such that it passes the refractive index pattern, the two transmitter arrays being set to the constant second phase difference; and
  decoding the amplitude information and the phase information from the optical power measured for the first light pulse and the second light pulse.

The invention claimed is:

1. An integrated optical circuit for holographic information processing, the integrated optical circuit comprising a photorefractive medium and two transmitter arrays, the two transmitter arrays being adapted for locally changing a refractive index of the photorefractive medium for holographic encoding of the holographic information in a working plane of the photorefractive medium by transmitting light via optical paths into the photorefractive medium such that an interference pattern is generated in the working plane, the optical paths and the working plane being arranged in a single optical plane, wherein each of the two transmitter arrays comprise an electrical input and an array of output waveguides, the array of output waveguides being adapted for transmitting the light into the photorefractive medium, each of the two transmitter arrays being adapted for modulating the light transmitted through the array of output waveguides based on an electrical modulation signal received through the electrical input in order to encode the holographic information.

2. The integrated optical circuit of claim 1, being adapted for encoding the holographic information by simultaneously generating the interference pattern for at least two different combinations of an output waveguide of a first one of the two transmitter arrays and an output waveguide of a second one of the two transmitter arrays.

3. The integrated optical circuit of claim 1, wherein at least one of the two transmitter arrays comprising a binary tree of passive power splitters, the binary tree being adapted for distributing the light into the array of output waveguides, the at least one of the two transmitter arrays further comprising an optical modulator for at least part of the array of output waveguides, the optical modulator being adapted for performing the light modulation.

4. The integrated optical circuit of claim 1, wherein at least one of the two transmitter arrays comprising a binary tree of electrically controllable power splitters, the binary tree being adapted for distributing the light into the array of output waveguides, the electrically controllable power splitters being adapted for performing the light modulation.

5. The integrated optical circuit of claim 1, wherein the modulation of the light comprises either being amplitude modulation and/or phase modulation.

6. The integrated optical circuit of claim 1, further comprising a propagation region adapted for coupling the light received from the two transmitter arrays into the photorefractive medium.

7. The integrated optical circuit of claim 6, wherein the propagation region being confined perpendicular to the single optical plane by cladding layers having a lower refractive index than the propagation region.

8. The integrated optical circuit of claim 6, wherein the propagation region comprising a first set of optical elements arranged in the optical paths and optically coupling the photorefractive medium to at least one of the two transmitter arrays.

9. The integrated optical circuit of claim 8, wherein the first set of optical elements being adapted for transforming a light wave emerging from the at least one of the two transmitter arrays into a plane light wave incident to the photorefractive medium.

10. The integrated optical circuit of claim 1, further comprising a light input adapted for transmitting the light into the integrated optical circuit, each of the two transmitter arrays being optically coupled to the light input and being adapted for transmitting the light received from the optical input into the photorefractive medium.

11. The integrated optical circuit of claim 1, further comprising two receiver arrays, each of the two receiver arrays comprising an electrical output and being adapted for measuring optical power received from the photorefractive medium, generating an electrical signal encoding the measured optical power, and outputting the electrical signal through the electrical output, the integrated optical circuit being adapted for controlling the holographic encoding using the electrical output as feedback.

12. The integrated optical circuit of claim 11, wherein each of the two receiver arrays further comprises a plurality of input waveguides, each of the two receiver arrays being adapted for independently measuring optical power received from the photorefractive medium by at least a receiving portion of the plurality of input waveguides, the electrical signal encoding the measured optical power and an identifying information for each of the receiving portion of the plurality of input waveguides.

13. The integrated optical circuit of claim 11, wherein each of the two receiver arrays being optically coupled to the light input and being further adapted for measuring a phase difference between the light received from the photorefractive medium and the light received from the light input, the electrical signal further encoding the measured phase difference.

14. The integrated optical circuit of claim 11, wherein a propagation region comprises a second set of optical elements, the second set of optical elements being arranged in the optical paths and optically coupling the photorefractive medium to at least one of the two receiver arrays.

15. The integrated optical circuit of claim 14, wherein the second set of optical elements being adapted for focusing a plane light wave emerging from the photorefractive medium onto at least one of the two receiver arrays.

16. A method for holographic information processing, the method comprising:
   providing an integrated optical circuit comprising a photorefractive medium and two transmitter arrays; and
   changing, locally, a refractive index of the photorefractive medium for holographic encoding of information in a working plane of the photorefractive medium by transmitting light from the two transmitter arrays via optical paths into the photorefractive medium such that an interference pattern is generated in the working plane, the optical paths and the working plane being arranged in a single optical plane, wherein each of the two transmitter arrays comprise an electrical input and an array of output waveguides, the array of output waveguides being adapted for transmitting the light into the photorefractive medium, each of the two transmitter arrays being adapted for modulating the light transmitted through the array of output waveguides based on an electrical modulation signal received through the electrical input in order to encode the holographic information.

17. A method for holographic information processing, the method comprising:
   providing an integrated optical circuit comprising a photorefractive medium, two transmitter arrays, and two receiver arrays, the photorefractive medium comprising a refractive index pattern holographically encoding holographic information; and
   decoding the holographic information by measuring optical power of a light pulse received by the two receiver arrays, the light pulse being directed through the two transmitter arrays into the photorefractive medium such that it passes the refractive index pattern.

18. The method of claim 17, wherein the holographic information comprises an amplitude information and a phase information, each of the two transmitter arrays being adapted for applying a phase modulation to the light pulse, the decoding comprising:
   selecting a constant first phase difference between the two transmitter arrays for the phase modulation;
   measuring the optical power of a first light pulse received by the two receiver arrays, the first light pulse being directed through the two transmitter arrays into the photorefractive medium such that it passes the refractive index pattern, the two transmitter arrays being set to the constant first phase difference;
   selecting a constant second phase difference between the two transmitter arrays for the phase modulation, the constant second phase difference differing from the constant first phase difference by between 45 and 135 degrees;
   measuring the optical power of a second light pulse received by the two receiver arrays, the second light pulse being directed through the two transmitter arrays into the photorefractive medium such that it passes the refractive index pattern, the two transmitter arrays being set to the constant second phase difference; and
   decoding the amplitude information and the phase information from the optical power measured for the first light pulse and the second light pulse.

* * * * *